United States Patent [19]
Watanabe et al.

[11] Patent Number: 5,012,500
[45] Date of Patent: Apr. 30, 1991

[54] X-RAY MASK SUPPORT MEMBER, X-RAY MASK, AND X-RAY EXPOSURE PROCESS USING THE X-RAY MASK

[75] Inventors: Yutaka Watanabe, Atsugi; Yasuaki Fukuda, Hadano; Shigetaro Ogura, Tama, all of Japan

[73] Assignee: Canon Kabushiki Kaisha, Tokyo, Japan

[21] Appl. No.: 290,624

[22] Filed: Dec. 27, 1988

[30] Foreign Application Priority Data

Dec. 29, 1987 [JP] Japan ................................. 62-335224

[51] Int. Cl.⁵ ............................................. G21K 5/00
[52] U.S. Cl. ......................................... 378/35; 378/34; 250/492.2
[58] Field of Search ..................... 378/34, 35; 430/5; 250/492.2

[56] References Cited

U.S. PATENT DOCUMENTS

| | | |
|---|---|---|
| 3,974,392 | 8/1976 | Bernacki . |
| 4,637,684 | 1/1987 | Tomita et al. . |
| 4,677,042 | 6/1987 | Kato et al. .............................. 378/35 |
| 4,707,059 | 11/1987 | Ogura et al. . |

FOREIGN PATENT DOCUMENTS

| | | |
|---|---|---|
| 5799742 | 12/1980 | Japan . |
| 592324 | 6/1982 | Japan . |
| 60132323 | 12/1983 | Japan . |
| 61245161 | 4/1985 | Japan . |

OTHER PUBLICATIONS

Inorganic and Theoretical Chemistry, vol. VIII, J. W. Mellor, p. 114, Kagaku to Kogyo (Chemistry and Chemical Industry), vol. 37, No. 9 (1984).

Primary Examiner—Carolyn E. Fields
Assistant Examiner—David P. Porta
Attorney, Agent, or Firm—Fitzpatrick, Cella, Harper & Scinto

[57] ABSTRACT

An X-ray mask support member comprises a support frame, and a support membrane which is held thereon and comprises X-ray-transmissive membranes laminated in multiple layers. The support membrane comprises and holds between the multi-layers at least one layer of a transmissive membrane T having an electrical resistivity of $1 \times 10^{-4}$ Ω·cm or less.

36 Claims, 2 Drawing Sheets

X-RAY MASK SUPPORT MEMBER, X-RAY MASK, AND X-RAY EXPOSURE PROCESS USING THE X-RAY MASK

BACKGROUND OF THE INVENTION

1. Field of The Invention

The present invention relates to an X-ray mask for manufacturing semiconductor devices such as integrated circuits (IC) and very large scale integrated (VLSI) circuits. More particularly it is concerned with an X-ray mask, suitable for an exposure apparatus for manufacturing semiconductor devices that uses a soft X-ray having wavelengths of about 2 Å to about 150 Å.

2. Related Background Art

In recent years, in exposure apparatus for manufacturing of semiconductor devices such as IC and VLSI, many kinds of exposure apparatus utilizing soft X-rays and capable of obtaining prints with a higher resolution have been proposed as semiconductor devices have become more highly integrated.

In general, the X-ray mask used in this soft-X-ray apparatus comprises a support frame having the shape of a ring, and a film member stretched to cover its opening and having X-ray transmitting portions and X-ray non-transmitting portions.

The non-transmitting portions are formed of an X-ray opaque material (including an absorber) having a geometrical pattern and provided on a support membrane (a mask membrane) that constitutes a substrate in said film member. The X-ray opaque material with a submicron size is provided on a wafer surface. On the other hand, the transmitting portions are formed of the mask support membrane itself corresponding to the part on which the light shielding material is not provided.

In the exposure apparatus using soft X-rays, both the space in which the X-ray mask is disposed and the upper space on the resist coated side on a wafer, in many instances, are put into a reduced pressure atmosphere or a low-pressure helium atmosphere in order to prevent the absorption loss of energy of the light irradiated from a soft-X-ray source for exposure.

If exposure is carried out with use of soft X-rays having wavelengths, for example, of approximately from 2 to 150 Å under such conditions, the X-ray mask support membrane, a mask absorber and atmospheric gas atoms absorb the soft X-ray and emit photoelectrons by the photoelectric effect. In particular, when the support membrane comprises an insulator as the thin membrane, such exposure causes not only electrostatic charging owing to the emission of photoelectrons from the constituent atoms of the support membrane but also electrostatic charging owing to the emission of photoelectrons from the absorber having a large number of electrons, resulting in a support membrane having a high positive potential.

In general, the distance between the support membrane and the resist surface on the wafer is so small that the run-out error caused by the divergence light from the source can be negligible, and is set, for example, in the range of from 10 μm to 100 μm. For this reason, the electrically charged support membrane and wafer may electrostatically attract each other, resulting in deformation of the support membrane, so that it sometimes occurs that the exposed pattern precision is lowered because of a flexure of the support membrane or that the support membrane comes into contact with the wafer when the attraction force is particularly strong.

In exposure apparatus aiming at obtaining a high resolution such that the pattern size to be transferred is 0.5 μm or less, the support membrane is commonly so constituted that it may have a thickness of about 2 μm, using an inorganic material (ceramics in particular) having a small thermal expansion coefficient and large Young's modulus. In this way misregistration due to its thermal expansion or the distortion of absorbers due to residual stress can be suppressed.

In general, many of materials for this purpose are brittle and hard. Hence, it sometimes occurs that the support membrane is easily broken by excessive deformation or application of nonuniform pressure.

As a means to settle this problem, there is, for example, a method in which a metal having small absorption to X-rays, as exemplified by aluminum, is deposited on the surface to a thickness of about several hundred Å. This method can achieve a good electric conductance and good soft-X-ray transmittance, but has the problem that the transmission of visible or infrared light for achieving alignment between the mask and the wafer is so extremely low that precise alignment may be extremely difficult.

SUMMARY OF THE INVENTION

An object of the present invention is to provide an X-ray mask support member, an X-ray mask, and an X-ray exposure process using the X-ray mask,. that can effectively prevent the phenomenon of electrostatic attraction or contact of X-ray masks by appropriately disposing an X-ray mask support membrane in an exposure apparatus that employs soft X-rays. This system and process can thereby prevent reflection of visible or infrared light used to achieve alignment so as to give, for example, a reflectance of 20% or less, to prevent the light reflected from a mask and the light reflected from a wafer from being mixed during alignment. Thus making it possible to achieve alignment with high precision.

The above object can be achieved by the invention described below.

The present invention provides an X-ray mask support member comprising a support frame, and a support membrane which is held thereon and comprises X-ray-transmissive membranes laminated multiple or multi-layers, wherein said support membrane comprises and holds between the multi-layers at least one layer of a transmissive membrane T having an electrical resistivity of $1 \times 10^{-4}$ Ω·cm or less.

The present invention also provides an X-ray mask member comprising a support frame, a support membrane which is held thereon and comprises X-ray-transmissive membranes laminated in multi-layers, and an X-ray absorber provided in a pattern formed on the surface of said support membrane, wherein said support membrane comprises and holds between the multi-layers at least one layer of a transmissive membrane T having an electrical resistivity of $1 \times 10^{-4}$ Ω·cm or less.

The present invention further provides an X-ray exposure process, comprising the steps of;

disposing an X-ray mask member with respect to a wafer with an X-ray sensitive member thereon, wherein the mask member comprises (i) a support frame, (ii) a support membrane which is stretched and held thereon and comprises X-ray-transmissive membranes so laminated in multi-layers as to hold therebetween at least one layer of a transmissive membrane T having an electrical resistivity of $1\times10^{-4}$ Ω·cm or less, and (iii) an X-ray absorber provided in a pattern formed on the surface of said support membrane; aligning said X-ray mask with said wafer; and irradiating the wafer through said X-ray mask with X-rays.

In another embodiment of the process, the present invention also provides an X-ray exposure process, comprising the steps of;

disposing an X-ray mask member with respect to a wafer with an X-ray sensitive member thereon, wherein the mask member comprises (i) a support frame, (ii) a support membrane which is stretched and held thereon and comprises X-ray-transmissive membranes so laminated in multi-layers as to hold therebetween at least one layer of a transmissive membrane T having an electrical resistivity of $1\times10^{-4}$ Ω·cm or less, and (iii) an x-ray absorber provided in a pattern formed on the surface of said support membrane; aligning said X-ray mask with said wafer;

irradiating the wafer through said X-ray mask with X-rays; and eliminating electric charges of said X-ray mask.

DETAILED DESCRIPTION OF THE PREFERRED EMBODIMENTS

Figure 1:
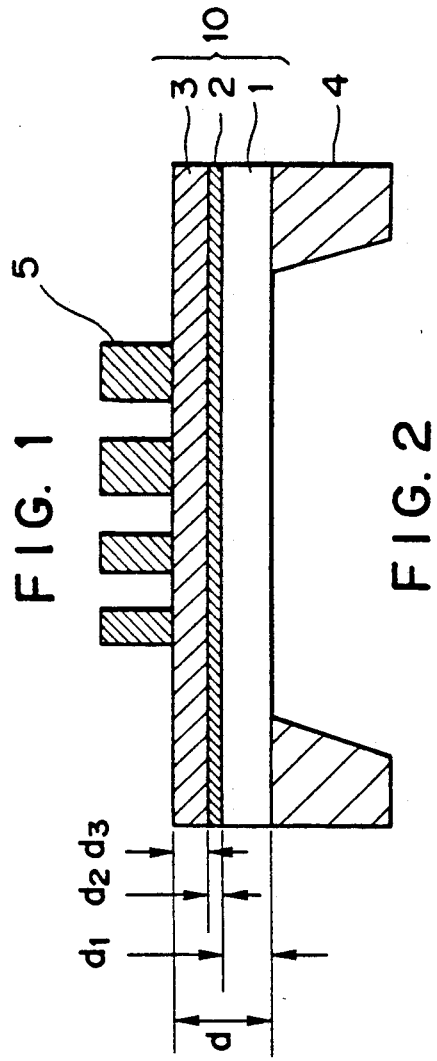
FIG. 1 is a schematic cross section of an embodiment of the X-ray mask of the present invention.

FIG. 1 is a schematic cross section of the X-ray mask of the present invention. In FIG. 1, the numeral 10 denotes a support membrane, constituted of a plurality of transmissive layers 1, 2 and 3 having a given transmittance to soft X-rays. The numeral 4 denotes a support frame having the shape of a ring; and 5 denotes a non-transmissive layer comprising an absorber to the soft X-rays, which is geometrically drawn on the support membrane 10 to form a pattern.

In the present embodiment, among the transmissive layers having a multi-layer laminated structure and constituting the support membrane 10, at least one transmissive membrane T, for example, the transmissive layer 2 in FIG. 1, is comprised of a material having an electrical resistivity of $1\times10^{-4}$ Ω·cm or less.

Thickness $d_2$ of the transmissive layer 2 is set to be not less than 5 nm and not more than 50 nm. If the thickness of the transmissive layer 2 is larger than 50 nm, an excessive absorption of soft X-rays in the transmissive layer 2 may result. If the thickness is smaller than 5 nm, a decrease in the effect of preventing the support membrane from being electrostatically charged may result. These phenomena are undesirable.

The higher the X-ray transmittance of the support membrane 10 is, the better the performance of the membrane as an X-ray membrane. For this purpose it may preferably be constituted as thinly as possible when the same kind of material is used. However, its mechanical strength to a certain degree must also be ensured, and it becomes necessary for it to have a given thickness.

Accordingly, in the present embodiment, the total thickness of the support membrane 10 is set to be not less than 1 μm and not more than 15 μm in instances in which the support membrane 10 comprises an organic material as one of the transmissive layers, because of its smaller absorption to the soft X-rays per unit thickness, and is set to be not less than 0.5 μm and not more than 5 μm in instances in which it comprises as one of the transmissive layers an inorganic material mainly composed of light elements.

When the support membrane 10 having the multi-layer laminated structure is aligned with a wafer, the support membrane is so set that the light reflected from a mask and the light reflected from a wafer can be prevented from being mixed and thus the wafer signal light can be efficiently obtained. More specifically, the material and thickness for the uppermost transmissive layer 3 are appropriately set so that the reflectance to the light used to achieve alignment, among visible light or infrared light, is low, for example, 20% or less. Also, the transmissive membrane T is so provided that it may be the second or further layer counting from the surface of one side of the multi-layer laminated transmissive membrane, thus weakening the electrostatic charging effect that is produced by the emission of photoelectrons of soft X-rays.

In the present embodiment, the transmissive membrane having an electrical resistivity of $1\times10^{-4}$ Ω·cm or less is constituted the one of materials selected from the group consisting of transition metals such as iron, cobalt, nickel, copper, zinc, molybdenum, ruthenium, rhodium, palladium, silver, cadmium, tungsten, osmium, iridium, platinum and gold, indium, beryllium and aluminum.

Besides these, applicable as materials for the transmissive layers constituting the multi-layer laminated structure are organic materials such as polyimide, polyamide, polyethylene terephthalate and poly p-xylylene, and inorganic materials mainly composed of light elements such as silicon carbide, silicon nitride, aluminum nitride, silicon dioxide and boron nitride.

In the embodiment illustrated in FIG. 1, the support membrane of the multi-layer laminated structure is constituted of three layers, but of course may be constituted of more than three layers.

Figure 2:
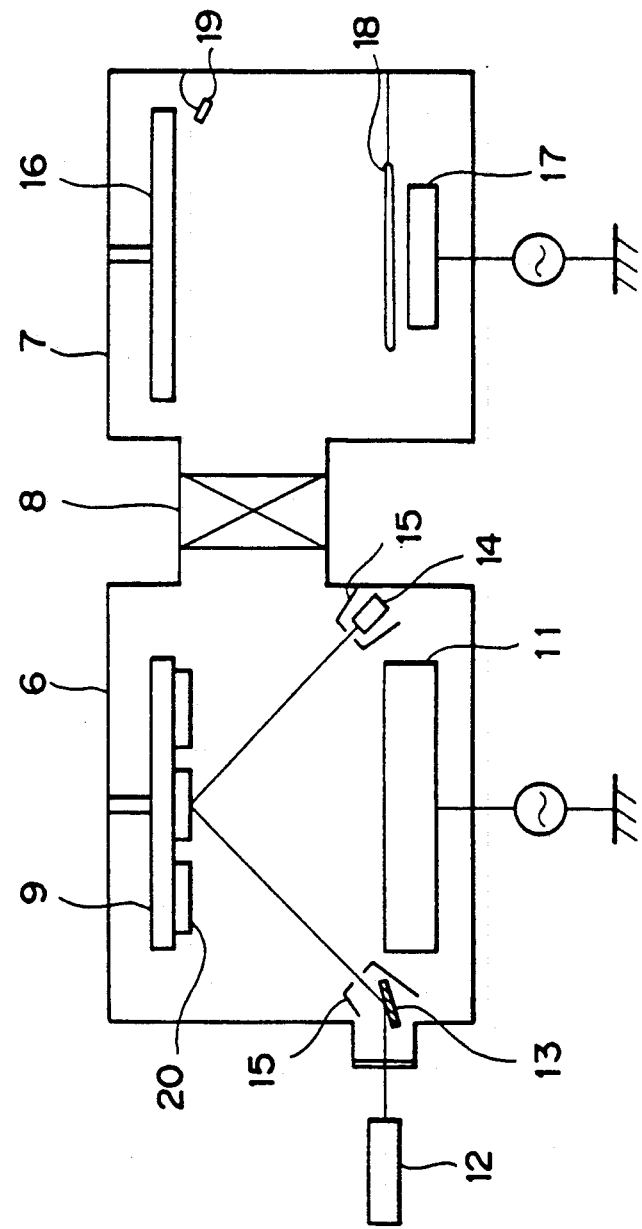
FIG. 2 is a schematic illustration of an embodiment for preparing the X-ray mask support membrane according to the present invention.

FIG. 2 is a schematic illustration of a first embodiment of an apparatus for preparing the X-ray mask support membrane according to the present invention. In FIG. 2, the numeral 6 denotes a plasma CVD (chemical vapor deposition) chamber; 7, a magnetron sputtering chamber, which are so constructed that a valve 8 provided therebetween may be opened or closed, thereby enabling continuous formation of membranes which can be repeated without exposing to the atmosphere a substrate 20 used in the formation of the membranes.

The substrate 20 is comprised, for example, of a silicon substrate of 2 mm in thickness, polished to have a surface roughness of 0.01 μm.rms, and is placed on a sample holder which is provided in the plasma CVD chamber and can be heated up to 800° C.

On the X-ray mask support member (or maskblank) described above in detail, an X-ray absorption pattern can be formed according to the following procedures, to prepare an X-ray mask.

Any X-ray absorbers previously used in conventional X-ray mask structures, such as thin films (having a thickness, for example, approximately of from 0.8 to 1 μm) of materials generally having a high density, as exemplified by gold, platinum, tungsten, tantalum, copper, nickel, and a material containing any of these, can be used in the present invention as the X-ray absorber to be formed on the above support membrane, without any particular limitations.

Such an X-ray absorber is formed, for example, by (i) providing a plating electrode layer on the above support membrane, patterning thereon a single-layer or multi-layer resist by electron-beam drawing, and (ii) electro plating, for example, of gold to form a gold pattern serving as the X-ray absorber. Alternatively, a film of W or Ta is formed on the support membrane and a single-layer or multi-layer resist is formed thereon by electron-beam drawing, followed by plasma etching of the W or Ta layer. Thus the X-ray absorber can be formed. Particularly when an inorganic membrane is formed on a silicon substrate, the X-ray absorber may be formed before the back etching of a silicon wafer.

Figure 3:
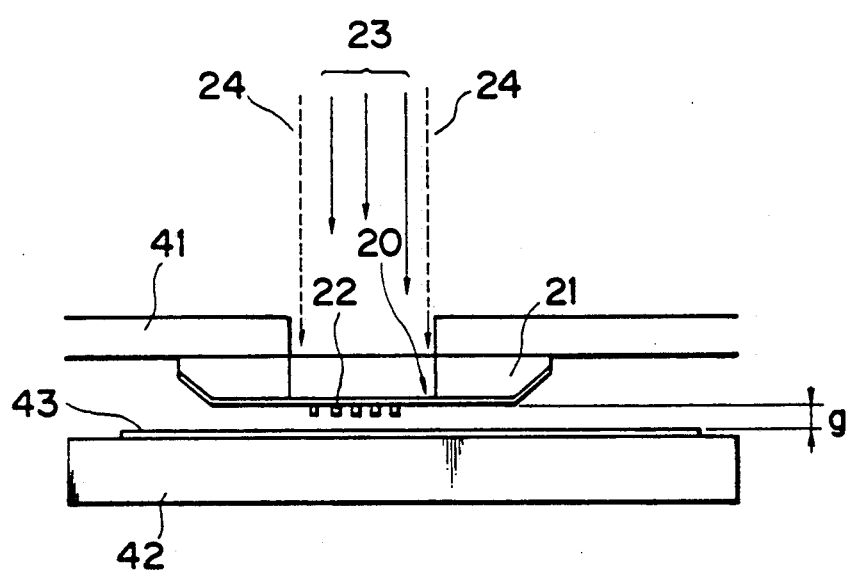
FIG. 3 is a schematic cross section useful in describing the X-ray exposure process of the present invention.

FIG. 3 schematically illustrates a manner of carrying out X-ray proximity exposure by using a mask comprising a membrane 20 on which an absorber 22 has been formed.

The mask is fixed to a mask stage 41 through a frame 21 by chucking or the like means. On the other hand, a silicon wafer 43 coated with an X-ray resist is fixed on a wafer chuck 42 by a vacuum attraction or the like means. At this time a gap g called a proximity gap is provided between the mask membrane and the surface of the wafer resist so thai the mask can be prevented from coming into contact with the wafer thereby to prevent breakage of the mask. The gap g is usually in range between 5 $\mu$m and 100 $\mu$m.

X-ray exposure is carried out using the exposure apparatus thus constituted. First, an alignment mark on the mask and an alignment mark on the wafer are registered with alignment light 24 of visible or infrared wavelengths to achieve alignment whereby the relationship between the mask and wafer may be brought into a predetermined positional relationship. After the alignment has been completed, X-rays 23 for exposure are irradiated for a necessary period of time through a shutter separately provided.

Usually the exposure irradiation zone on the X-ray mask is smaller than the wafer, and hence it is common to continue to expose the whole wafer surface while repeating the operation of alignment/X-ray irradiation/stage movement.

Also, in order to prevent accumulating electrostatic charges on the support membrane 10 and the surface of the wafer 43 with an X-ray sensitive member thereon upon irradiation with X-rays, measures are taken for elimination of electric charges, such that;

(1) the support membrane 10 and wafer are both grounded;
(2) the support membrane 10 is electrically connected to the wafer 43; or
(3) voltage is applied to each of the support membrane 10 and wafer 43 so as to cancel the potential difference between the support membrane 10 and wafer 43. Such elimination procedure should be carried out at least upon irradiation of X-rays.

As in the above process, the support membrane can be effectively protected from being electrostatically charged by the X-ray exposure, by using material having a given electrical resistivity, in at least one transmissive membrane of the X-ray mask support membrane having the multi-layer laminated structure comprising a plurality of transmissive layers, and also by setting the thickness of that membrane such that it may prevent reflection, so that deformation or the like can be prevented. This deformation may be caused by the electrostatic attraction accompanying electrostatic charging and it is possible to transfer e pattern with a high precision.

In addition, setting the support membrane so that it can prevent reflection of the light having a wavelength for the alignment makes it possible to reduce unnecessary light reflected from the surface of the support membrane at the time of making alignment, improve the transmittance, and readily obtain high alignment precision.

The present invention will be described below in more detail by giving Examples.

EXAMPLE 1

In the present example, making reference to FIG. 2, first the back pressure was reduced to $2\times10^{-6}$ Torr, and thereafter 5 sccm of silane gas diluted to 10% with hydrogen and 20 sccm of methane gas were fed from openings made in a lower electrode 11. The substrate 20 was heated to a temperature of 200° C., and 8 W of a high frequency power was applied under a pressure of $7.5\times10^{-3}$ Torr, to form a silicon carbide (SiC) layer with a layer thickness of 2.0 $\mu$m which corresponds to the transmissive layer 1 in FIG. 1.

The layer thickness was monitored by measuring the reflectance with use of a helium neon laser 12, a mirror 13 and a detector 14. The mirror 13 and detector 14 were protected with protective members 15.

Thereafter, the vacuum degree was made to be $2\times10^{-6}$ Torr substantially equal to that of the magnetron sputtering chamber 7. Then the valve 8 was opened and the substrate 20 on which the SiC layer with a layer thickness of 2.0 $\mu$m has been formed was placed on the sample holder 16. Then 100 W of a high frequency power was applied under an argon gas pressure made to be $5\times10^{-3}$ Torr, and a shutter 18 provided above a sputter target made of osmium (Os) was opened and shut to carry out formation of an osmium (Os) layer of 8 nm thick which corresponds to the transmissive layer 2 in FIG. 2.

At this time the substrate 20 was not heated, and the layer thickness was measured with a calibrated quartz coating thickness tester 19.

Further thereafter, the substrate on which the above layers were formed was put back to the plasma CVD chamber 6, and an SiC layer of 70 nm thick which corresponds to the transmissive layer 3 in FIG. 1 was formed under the same conditions as the initial layer 1.

Then the silicon substrate 20 as well cooled, and thereafter was subjected to back etching with a size of 25 mm square on the central part of its back surface, thus preparing an X-ray mask support membrane 10 having the multi-layer laminated structure of 2 $\mu$m thick SiC; 8 nm thick Os, and 70 nm thick SiC.

On this X-ray mask support membrane 10, a semiconductor laser beam of 830 nm in wavelength was made incident from the 70 nm thick SiC layer (transmissive layer 3) side in the direction perpendicular to the transmissive membrane to find the reflectance and transmittance, which were revealed to be 2% and 90%, respectively. In the case of a 2 $\mu$m thick SiC layer, the reflectance and transmittance were found to be 55% and 45%, respectively. Thus, as shown by this comparison, in the membrane having the thicker transmissive layer 3 reflectance steeply decreased and at the same time the transmittance was greatly improved.

On this X-ray mask support membrane, aluminum Kα-rays of 0.834 nm in wavelength were made incident to find the transmittance, revealed to be obtained 65% obtained. There was seen no increase in the ground potential of the support membrane.

In this example, the X-ray absorber 5 as illustrated in FIG. 1 was not formed on the support membrane 10, but the absorber 5 to soft X-rays, comprising gold or the like, is usually patterned in a required form before the back etching of the substrate 20.

In the case that distortion is produced in the required form of the absorber in carrying out the back etching, the absorber 5 to soft X-rays, comprising gold or the like, may be patterned in the desired form after the formation of the transmissive membrane.

EXAMPLE 2

A SiC layer with a thickness of 2.0 μm was formed on the silicon substrate 20 following entirely the same procedures as in Example 1 explained with reference to FIG. 2. Thereafter, magnetron sputtering was carried out, provided that, in the present example, an Au layer of 8 nm thick as formed by using a sputter target comprising gold (Au). Thereafter, the substrate having thereon the above layer was put back in the plasma CVD chamber to effect SiC layer formation having a layer thickness of 65 nm, followed by back etching, thus preparing an X-ray mask support membrane 10 having the multi layer laminated structure of 2 μm thick SiC, 8 nm thick Au, and 65 nm thick SiC.

On this X-ray mask support membrane, a semiconductor laser beam of 830 nm in wavelength was made incident from the 65 nm thick SiC layer (transmissive layer 3) side in the direction perpendicular to the transmissive membrane to find the reflectance and transmittance, which were revealed to be 3% and 95%, respectively.

Aluminum Kα-rays of 0.834 nm in wavelength were also made incident to find the transmittance, revealed to be of 65%. There also was seen no increase in the ground potential of the support membrane.

EXAMPLE 3

A silicon substrate 20 having a thickness of 2 μm and polished to a surface roughness of 0.01 μm.rms was set on the sample holder 9 shown in FIG. 2. After back pressure was reduced to $2 \times 10^{-6}$ Torr, 5 sccm of silane gas diluted to 10% with hydrogen and 20 sccm of ammonia were fed from the opening provided in the lower electrode. The substrate 20 was heated to a temperature of 250° C., and 20 W of a high frequency power was applied under a pressure of $7.5 \times 10^{-3}$ Torr, to form a silicon nitride ($SiN_x$) layer with a layer thickness of 2.0 μm. This silicon nitride was presumed to contain a little amount of hydrogen, but its refractive index was about 2.0 with respect to a wavelength of 830 nm, showing substantially the same refractive index as $Si_3N_4$. Also, it was etched using a buffer etching solution, resulting in an etching rate a little larger than that for $Si_3N_4$.

On the $SiN_x$ layer formed with a thickness of 2.0 μm on the silicon substrate 20, an 8 nm thick osmium (Os) layer was formed by sputtering. Conditions for the sputtering were the same as those in the above Example 1. Thereafter, a 70 nm thick $SiN_x$ layer was further formed thereon, followed by back etching, thus preparing an X-ray mask support membrane having the multi-layer laminated structure of 2 μm thick $SiN_x$, 8 nm thick Os, and 70 nm thick $SiN_x$.

On this X-ray mask support membrane, a semiconductor laser beam of 830 nm in wavelength was made incident from the 70 nm thick $SiN_x$ layer (transmissive layer 3) side in the direction perpendicular to the transmissive membrane to find the reflectance and transmittance, which were revealed to be less than 1%, and 75%, respectively. The reflectance and transmittance of an 2 μm thick $SiN_x$ transmissive membrane prepared in the same manner as in the present example was 28% and 70%, respectively. Thus, the reflectance steeply decreased and the transmittance was improved.

Aluminum Kα-rays of 0.834 nm in wavelength were also made incident on the resulting X-ray mask support membrane to find the transmittance, revealed to be 55%. There also was seen no increase in the ground potential of the support membrane.

EXAMPLE 4

As a fourth example, a support membrane comprising silicon carbide (SiC) having a carbon content larger than the stoichiometric composition (silicon:carbon=1:1) was prepared according to a method of firing an organic silicon compound polysilastyrene.

First, polysilastyrene (trade name: S-400; a product of Nippon Soda Co., Ltd.) was dissolved in toluene to prepare a 10% wt/V solution. This solution was coated using a spinner on a carbon substrate those surface has been mirror-polished, to form a polysilastyrene film with a thickness of 20 μm. Next, this film was put in a firing furnace together with the substrate to carry out firing in a dry nitrogen atmosphere at 200° C. for 1 hour, and the temperature was raised up to 1,250° C. at a rate of 100° C./min and maintained at that temperature for 25 hours. Thereafter the heating of the furnace was stopped to effect spontaneous cooling to obtain a support membrane with a thickness of 2.0 μm, comprising silicon carbide. Electrical resistivity of the support membrane at this time was measured and found to be 0.1 Ω·cm.

On this support membrane, gold (Au) was deposited to a thickness of 8 nm, and a SiC layer was further formed thereon by sputtering. Here, a graphite sheet was overlapped on the target so as to be 10 % in area ratio so that the carbon composition may deviate from the stoichiometric ratio by 3% to 10% to impart electrical conductivity to the layer.

An absorber was formed on the X-ray mask support membrane having the multi-layer laminated structure of 2.0 μm thick SiC, 8 nm thick Au, and 65 nm thick SiC which was formed through the above procedures.

On this X-ray mask support membrane, a semiconductor laser beam of 830 nm in wavelength was made incident from the 65 nm thick SiC layer transmissive layer 3) side in the direction perpendicular to the transmissive membrane to find the reflectance and transmittance, which were revealed to be 3% and 95%, respectively.

Aluminum Kα-rays of 0.834 nm in wavelength were also made incident on the resulting X-ray mask support membrane to find the transmittance, revealed to be 65%. There also was seen no increase in the ground potential of the support membrane.

In the above respective Examples, magnetron sputtering and the plasma CVD process were used in combination in preparing the multi-layer laminated structure, but, besides these, EB vapor deposition, resistance heating, or sputtering other than the above, reactive sputtering, and CVD processes other than those described above may also be used.

As methods of forming organic membranes, it is also possible to use spin coating, LB processes or the like. Two different materials were formed into layers with use of two different layer formation methods, but two or more materials may be formed into layers with use of the same layer formation methods.

All the above respective Examples described the instances in which the first layer and the third layer were composed of the same materials, but the layers may be composed of materials such that all the layers are different.

The layer thickness was also set so as to provide a reflection preventive membrane against semiconductive laser beams of 830 nm in wavelength, but there may also be used light rays of any wavelengths including visible light and infrared light so long as the light is for use in the alignment.

We claim:

1. An X-ray mask support member comprising a support frame, and a support membrane which is held on said support frame and includes X-ray-transmissive membranes laminated in multiple layers, wherein said support membrane comprises and holds between the multiple layers at least one layer of a transmissive membrane T having an electrical resistivity of $1 \times 10^{-4}$ $\Omega$·cm or less.

2. The X-ray mask support member according to claim 1, wherein said transmissive membrane T comprises one of the materials selected from the group consisting of transition elements, indium, beryllium and aluminum.

3. The X-ray mask support member according to claim 1, wherein said transmissive membrane T comprises one of the materials selected from the group consisting of transition elements including iron, cobalt, nickel, copper, zinc, molybdenum, ruthenium, rhodium, palladium, silver, cadmium, tungsten, osmium, iridium, platinum and gold, indium, beryllium and aluminum.

4. The X-ray support member according to claim 1, wherein the support member comprises an organic membrane as one of the transmissive layers, and wherein the total layer thickness of said support membrane is in the range of from 1 $\mu$m to 15 $\mu$m.

5. The X-ray mask support member according to claim 1, wherein the support membrane comprises an inorganic membrane as one of the transmissive layers, and wherein the total layer thickness of said support membrane is in the range of from 0.5 $\mu$m to 5 $\mu$m.

6. The X-ray mask support member according to claim 1, wherein said support membrane has a reflectance of not more than 20% to visible or infrared light.

7. The X-ray mask support member according to claim 4, wherein said support membrane is stretched over said support frame.

8. An X-ray mask member comprising a support frame, a support membrane which is held on said support frame and includes X-ray-transmissive membranes laminated in multiple layers, and an X-ray absorber provided in a pattern formed on the surface of said support membrane, wherein said support membrane comprises and holds between the multiple layers at least one layer of a transmissive membrane T having an electrical resistivity of $1 \times 10^{-6}$ $\Omega$·cm or less.

9. The X-ray mask member according to claim 8, wherein said transmissive membrane T comprises one of the materials selected from the group consisting of transition elements, indium, beryllium and aluminum.

10. The X-ray mask member according to claim 8, wherein said transmissive membrane T comprises one of the materials selected from the group consisting of transition elements including iron, cobalt, nickel, copper, zinc, molybdenum, ruthenium, rhodium, palladium, silver, cadmium, tungsten, osmium, iridium, platinum and gold, indium, beryllium and aluminum.

11. The X-ray mask member according to claim 8, wherein the support member comprises an organic membrane as one of the transmissive layers, and wherein the total layer thickness of said support membrane is in the range of from 1 $\mu$m to 15 $\mu$m.

12. The X-ray mask member according to claim 8, wherein the support membrane comprises an inorganic membrane as one of the transmissive layers, and wherein the total layer thickness of said support membrane is in the range of from 0.5 $\mu$m to 5 $\mu$m.

13. The X-ray mask according to claim 8, wherein said support membrane has a reflectance of not more than 20% to visible or infrared light.

14. The X-ray mask member according to claim 11, wherein said support membrane is stretched over said support frame.

15. An X-ray exposure process, comprising the steps of:
disposing an X-ray mask member with respect to a wafer having an X-ray sensitive member thereon, said X-ray mask member comprising (i) a support frame, (ii) a support membrane held on said support frame and comprising X-ray-transmissive membranes laminated in multiple layers so as to hold therebetween at least one layer of a transmissive membrane T having an electrical resistivity of $1 \times 10^{-4}$ $\Omega$·cm or less, and (iii) an X-ray absorber provided in a pattern formed on the surface of said support membrane, said disposing step aligning said X-ray mask with said wafer; and
irradiating the wafer through said X-ray mask with X-rays.

16. The X-ray exposure process according to claim 15, wherein said transmissive membrane T comprises one of the materials selected from the group consisting of transition elements, beryllium, aluminum and indium.

17. The X-ray exposure process according to claim 15, wherein the support membrane comprises an organic membrane as one of the transmission layers, and wherein the total layer thickness of said support membrane is in the range of from 1 $\mu$m to 15 $\mu$m.

18. The X-ray exposure process according to claim 15, wherein the support membrane comprises an inorganic membrane as one of the transmissive layers, and wherein the total layer thickness of said support membrane is in the range of from 0.5 $\mu$m to 5 $\mu$m.

19. The X-ray exposure process according to claim 15, wherein said support membrane has a reflectance of not more than 20% to visible or infrared light.

20. The X-ray exposure process according to claim 17, wherein said support membrane is stretched over said support frame.

21. The X-ray exposure process according to claim 15, wherein said X-ray mask is disposed with respect to the wafer with a gap of from 5 $\mu$m to 100 $\mu$m therebetween.

22. The X-ray exposure process according to claim 15, wherein said aligning is carried out by irradiating the wafer through said X-ray mask with visible or infrared light.

23. The X-ray exposure process according to claim 15, wherein the surface of said X-ray mask is in parallel to the surface of said wafer.

24. An X-ray exposure process, comprising the steps of:
   disposing an X-ray mask member with respect to a wafer having an X-ray sensitive member thereon, said X-ray mask member comprising (i) a support frame, (ii) a support membrane held on said support frame and comprising X-ray-transmissive membranes laminated in multiple layers so as to hold therebetween at least one layer of a transmissive membrane T having an electrical resistivity of $1 \times 10^{-4}$ Ω·cm or less, and (iii) an X-ray absorber provided in a pattern formed on the surface of said support membrane, said disposing step aligning said X-ray mask with said wafer;
   irradiating the wafer through said X-ray mask with X-rays; and
   eliminating electric charges on said X-ray mask.

25. The X-ray exposure process according to claim 24, wherein said eliminating of electric charges is carried out at least upon irradiation of X-rays.

26. The X-ray exposure process according to claim 24, wherein said transmissive membrane T comprises one of the materials selected from the group consisting of transition elements, indium, beryllium and aluminum.

27. The X-ray exposure process according to claim 24, wherein the support membrane comprises an organic membrane as one of the transmission layers, and wherein the total layer thickness of said support membrane is in the range of from 1 μm to 15 μm.

28. The X-ray exposure process according to claim 24, wherein the support membrane comprises an inorganic membrane as one of the transmissive layers, and wherein the total layer thickness of said support membrane is in the range of from 0.5 μm to 5 μm.

29. The X-ray exposure process according to claim 24, wherein said support membrane has a reflectance of not more than 20% to visible or infrared light.

30. The X-ray exposure process according to claim 27, wherein said support membrane is stretched over said support frame.

31. The X-ray exposure process according to claim 24, wherein said X-ray mask is disposed with respect to the wafer with a gap of from 5 μm to 100 μm therebetween.

32. The X-ray exposure process according to claim 24, wherein the surface of said X-ray mask is in parallel to the surface of said wafer.

33. The X-ray exposure process according to claim 24, wherein said aligning is carried out by irradiating the wafer through said X-ray mask with visible or infrared light.

34. The X-ray exposure process according to claim 24, wherein said eliminating of electric charges is carried out by electrically connecting the support membrane with the wafer.

35. The X-ray exposure process according to claim 24, wherein said eliminating of electric charges is carried out by grounding each of the support membrane and wafer.

36. The X-ray exposure process according to claim 24, wherein said eliminating is carried out by applying an voltage to each of the support membrane and wafer so as to cancel the potential difference between them.

* * * * *

UNITED STATES PATENT AND TRADEMARK OFFICE
CERTIFICATE OF CORRECTION

PATENT NO. : 5,012,500
DATED : April 30, 1991
INVENTOR(S) : YUTAKA WATANABE ET AL.

Page 1 of 2

It is certified that error appears in the above-identified patent and that said Letters Patent is hereby corrected as shown below:

COLUMN 1

Line 39, "resist coated" should read --resist-coated--.

COLUMN 2

Line 9, "its" should be deleted.
Line 12, "of" should read --of the--.
Line 30, "mask,." should read --mask,--.
Line 46, "multiple" should read --in multiple--.
Line 59, "$1 \times 10^{-4 \Omega \cdot cm \ or \ less.}$" should read
--$1 \times 10^{-4} \Omega \cdot cm$ or less.--.

COLUMN 4

Line 26, "constituted" should read --constituted of--.
Line 65, "0.8" should read --0.5--.

COLUMN 5

Line 27, "thai" should read --that--.
Line 30, "range" should read --the range--.

COLUMN 6

Line 3, "e" should read --a--.
Line 56, "SiC;" should read --SiC,--.
Line 63, "layer," should read --layer 3,--.

UNITED STATES PATENT AND TRADEMARK OFFICE
CERTIFICATE OF CORRECTION

PATENT NO. : 5,012,500
DATED : April 30, 1991
INVENTOR(S) : YUTAKA WATANABE ET AL.

Page 2 of 2

It is certified that error appears in the above-identified patent and that said Letters Patent is hereby corrected as shown below:

COLUMN 7

Line 3, "obtained" should be deleted.
    Line 4, "obtained" should be deleted.
    Line 29, "multi layer" should read --multi-layer--.
    Line 40, "of" should be deleted.

COLUMN 8

Line 9, "was" should read --were--.
    Line 54, "transmissive" should read --(transmissive--.

COLUMN 9

Line 66, "$1 \times 10^{-6} \Omega \cdot cm$" should read --$1 \times 10^{-4} \Omega \cdot cm$--.

COLUMN 12

Line 33, "an" should read --a--.

Signed and Sealed this

First Day of December, 1992

Attest:

DOUGLAS B. COMER

*Attesting Officer*     *Acting Commissioner of Patents and Trademarks*